United States Patent [19]

Kurafuji

[11] Patent Number: 4,499,559
[45] Date of Patent: Feb. 12, 1985

[54] STATIC RAM WITH BIT-LINE-CHARGING TRANSISTOR

[75] Inventor: Setsuo Kurafuji, Kawasaki, Japan

[73] Assignee: Fujitsu Limited, Kawasaki, Japan

[21] Appl. No.: 575,718

[22] Filed: Jan. 31, 1984

Related U.S. Application Data

[63] Continuation of Ser. No. 261,876, May 8, 1981, abandoned.

[30] Foreign Application Priority Data

May 22, 1980 [JP] Japan ................ 55-68270

[51] Int. Cl.³ .................................... G11C 11/40
[52] U.S. Cl. .......................... 365/190; 365/203
[58] Field of Search .......... 365/154, 174, 177, 189, 365/190, 203, 204, 194, 230, 233

[56] References Cited

U.S. PATENT DOCUMENTS 4,062,000 12/1977 Donnelly ................ 365/190 X
4,386,419 5/1983 Yamamoto ................ 365/203

FOREIGN PATENT DOCUMENTS 54-150044 11/1979 Japan ................ 365/190
55-113190 9/1980 Japan ................ 365/174

Primary Examiner—Joseph A. Popek
Attorney, Agent, or Firm—Staas & Halsey

[57] ABSTRACT

A static RAM, including a bit-line-charging transistor connected, in parallel to the load transistor, between each bit line and the power supply. These bit-line-charging transistors are controlled by a control signal generator circuit, which provides a timed pulse to their gates at the conclusion of each write cycle. The width of this timed pulse is selected such that bit lines which have been driven to a low level (e.g., zero volts) during a write cycle are rapidly recharged to the low level (e.g., 2.5 volts) to which they might have been driven during a read cycle. Thus, reverse readout operations (e.g., where a "1" is read immediately after a "0" has been written) no longer pose an obstacle to improving read operation speed, and speed and density can be improved.

9 Claims, 3 Drawing Figures

STATIC RAM WITH BIT-LINE-CHARGING TRANSISTOR

This application is a continuation of application Ser. No. 261,876, filed May 8, 1981, now abandoned.

BACKGROUND OF THE INVENTION

This invention relates to a Random Access Memory (RAM) of the static type.

A memory cell of a static RAM is, in general, mainly composed of a flip-flop, and the higher the memory density becomes, the smaller the cell area is. Therefore, the conductance (gm) of the driver transistor in each cell is lowered, and, as a result, the bit line drive capability is reduced, requiring a small conductance (gm) load transistor for each bit line. However, such a static RAM has a disadvantage in that when the conductance (gm) of the bit line load transistor is small, the charging capability of the bit line becomes insufficient, and therefore the reverse data readout speed becomes low in a readout cycle immediately after a write cycle (i.e., where a "1" must be read immediately after a "0" has been written via the same bit line pair, or when a "0" is read immediately after a "1" has been written).

SUMMARY OF THE INVENTION

An object of the present invention is to avoid this disadvantage by providing one bit-line-charging transistor in parallel with each of the bit line load transistors. The bit-line-charging transistors are temporarily turned ON after the write operation, thus connecting both bit lines of each bit line pair to the power supply voltage, in order to promptly recharge them.

BRIEF DESCRIPTION OF THE DRAWING

The present invention will be explained below with reference to the accompanying drawings, wherein.

DESCRIPTION OF THE PREFERRED EMBODIMENT

Figure 1:
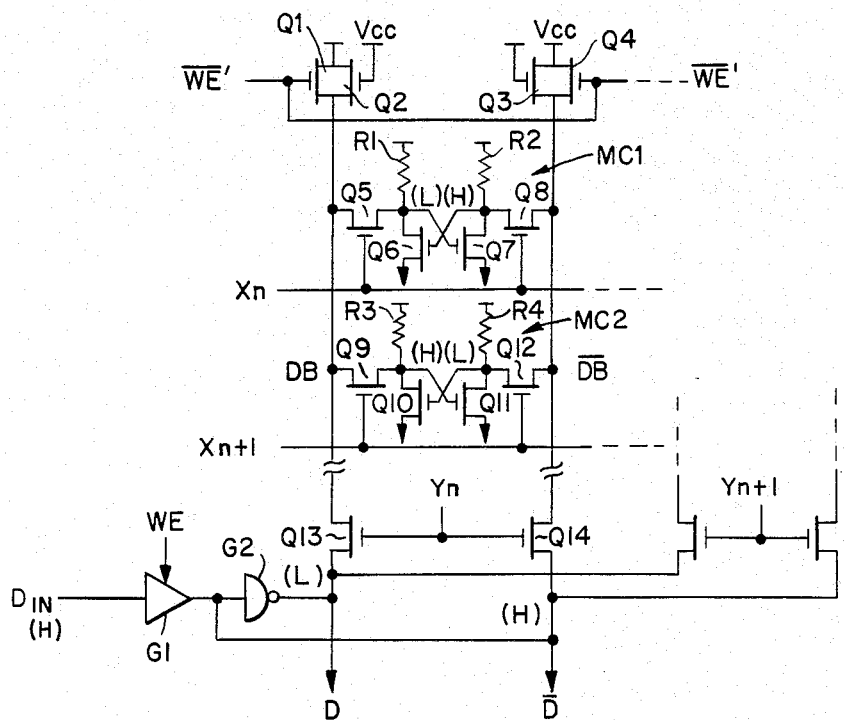
FIG. 1 is a circuit diagram schematically illustrating one column of static memory cells $MC_1$, $MC_2$, etc., connected to a pair of bit lines DB and $\overline{DB}$, to which bit-line-charging transistors $Q_1$ and $Q_4$ have been connected in parallel to the bit line load transistors $Q_2$ and $Q_3$, respectively, in accordance with the present invention.

FIG. 1 shows an embodiment of the present invention. Elements other than the transistors $Q_1$ and $Q_4$ are conventional elements. The transistors $Q_1$ and $Q_4$ are used for charging bit lines and are connected in parallel with the load transistors $Q_2$ and $Q_3$ of the bit lines DB and $\overline{DB}$, respectively. In the preferred embodiment, the transistors $Q_1$ and $Q_4$ are MOSFETs. The bit lines DB and $\overline{DB}$ are connected to a plurality of static type memory cells $MC_1$, $MC_2$..., which are selected by the word lines $X_n$, $X_{n+1}$,....

$Y_n$, $Y_{n+1}$,... are signals for bit line selection and when the transistors $Q_{13}$, $Q_{14}$ turn ON with the signal $Y_n$, the bit lines DB and $\overline{DB}$ are selected. The transistors $Q_5$, $Q_8$, $Q_9$ and $Q_{12}$ of cells $MC_1$, $MC_2$ are the transfer gates, which are turned ON and OFF by the voltage level of the word lines $X_n$ or $X_{n+1}$. The cells $MC_1$ and $MC_2$ are essentially composed of a flip-flop circuit including load resistances, $R_1$, $R_2$, $R_3$ and $R_4$, and driver transistors $Q_6$ and $Q_7$ and $Q_{10}$ and $Q_{11}$. The buffer $G_1$ and inverter $G_2$ form a write circuit. When the buffer $G_1$ is enabled by the write enable signal WE while the data input $D_{IN}$ is H (high) level the potentials of the bit lines become as follows: DB=L (low), $\overline{DB}$=H (high). At this time, if the gates $Q_5$ and $Q_8$ of the cell $MC_1$ have been turned ON, the transistor $Q_6$ turns ON while $Q_7$ turns OFF, allowing write operation to the cell $MC_1$.

Figure 2:
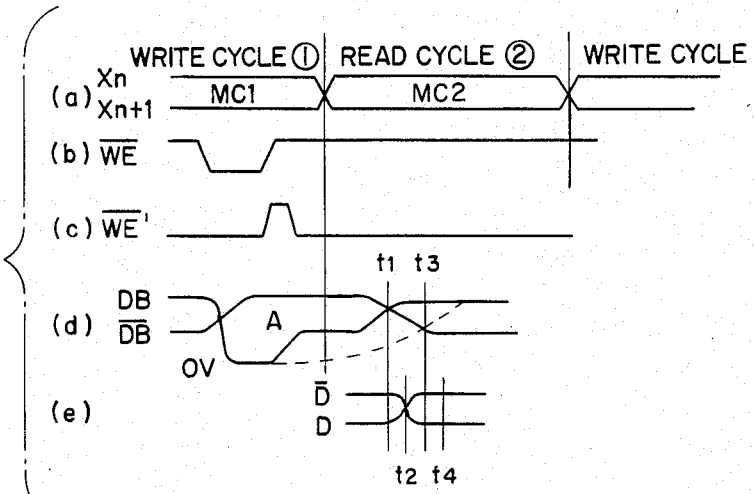
FIG. 2 is a graph illustrating operation signal waveforms, which appear at various points in the diagram of FIG. 1 during a reverse data read out operation.

A reverse data read out operation will now be described, to indicate the operation of the present invention, particularly as compared with other devices. FIG. 2A shows word selecting signals $X_n$ and $X_{n+1}$, which select memory cells $MC_1$ or $MC_2$, respectively, within the column shown in FIG. 1. (Of course, word address buffers, which are not shown, would routinely be used to provide the signals $X_n$ and $X_{n+1}$.) The specific example which will now be discussed assumes that a "0" is written into cell $MC_1$, and immediately thereafter a "1" is read out from memory cell $MC_2$. The signals associated with these two successive operations are shown in FIG. 2 beneath the headings write cycle (1) and read cycle (2), respectively. Thus, in write cycle (1) the bit lines are respectively set at DB=L (low), $\overline{DB}$=H (high), and in read cycle (2) the bit lines are respectively set at DB=H, $\overline{DB}$=L.

At the time of write cycle (1), the write enable signal $\overline{WE}$ becomes L, making DB=L, $\overline{DB}$=H in accordance with the data input $D_{IN}$. In this case, the level L is usually lowered to almost 0 V in order to maximize the write amplitude. Therefore, this L level of bit line DB at this time is very much lower than the L level (about 2.5 V) at the time of the readout operation, and in a reverse data readout operation, a large voltage swing must accordingly be forced on bit line DB.

In the conventional circuit structure, the bit line DB is charged only by the load transistor $Q_2$ from the power supply $V_{cc}$ at the time of read cycle (2), but since the conductance (gm) of $Q_2$ is low due to the high integration density, the potential of DB merely increases gradually, as indicated by the dotted line in FIG. 2D. Thus, the time $t_3$ where the potential levels of the bit lines DB and $\overline{DB}$ cross and, as a result, the timing $t_4$ where the potential levels of the data outputs D and $\overline{D}$ cross each other is delayed, thereby slowing the readout operation.

In order to solve this problem and improve the readout operation speed, the present invention provides the transistors $Q_1$ and $Q_4$, connected in parallel with the load transistors $Q_2$ and $Q_3$, which are temporarily turned ON when the write operation ends (i.e., when the write enable signal $\overline{WE}$ rises), so that the bit lines DB, $\overline{DB}$ are charged from the power supply $V_{cc}$ via the respective pairs of parallel transistors $Q_1$ and $Q_2$, and $Q_3$ and $Q_4$. This has the same results as if the bit line were charged by a load transistor having a large conductance (gm), and it becomes possible to quickly raise the bit line potential.

Figure 3:
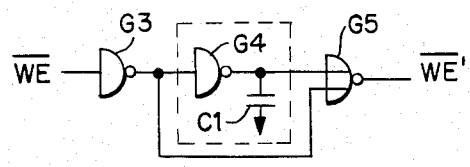
FIG. 3 schematically illustrates the structure of the control signal generator, which is used to generate the signal $\overline{WE}'$ for controlling the bit-line-charging transistors in accordance with the present invention.

The bit-line-charging transistors $Q_1$, $Q_4$ are controlled by the signal $\overline{WE}'$ (FIG. 2C) which is generated by the circuit shown in FIG. 3. $G_3$ is an inverter having an output connected to one input of the NOR gate $G_5$. Simultaneously, the output of the inverter $G_3$ is also connected to the input of a delay type inverter, comprising an inverter $G_4$ and a capacitor $C_1$. The output of this delay type inverter is fed to the other input of the NOR gate $G_5$. The signal $\overline{WE}'$ obtained from NOR gate $G_5$ is opposite in phase to the signal $\overline{WE}$, and has a waveform which remains at the H level only for a certain period, determined by the capacitance of capacitor $C_1$, after the falling edge of the signal $\overline{WE}$. Thus, because the transistors $Q_1$ and $Q_4$ are turned on by the signal $\overline{WE}'$, the bit line DB having the L level is rapidly charged after the end of the writing operation, and the potential increases as indicated by the curve A in FIG. 2D. The degree of increase of the potential depends on the width of the signal $\overline{WE}'$ and therefore the width of $\overline{WE}'$ is selected such that the bit line DB is increased from the write operation L level to the readout operation L level. In other words, when the write operation ends, the level L of the bit line DB is immediately set to the level L for the read operation. Thus, when the write cycle ① ends, the bit line DB increases in level from the L level of the write cycle ① and the reverse data readout (in the readout cycle ② starts with DB at the readout level L. Therefore, the potential levels of the bit lines DB, $\overline{DB}$ cross at the time $t_1$ (preceding the time $t_3$), while the potential levels of the data outputs D, $\overline{D}$ cross at the time $t_2$ (preceding the time $t_4$), so that the readout operation speed of the memory cells is improved.

As explained above, it is desirable that the period for keeping the bit-line-charging transistors $Q_1$, $Q_4$ ON be only temporary, at the end of a write cycle ①. If the transistors $Q_1$, $Q_4$ are kept ON during the read cycle ②, a large current would flow into the memory cells from the power supply $V_{cc}$, causing increased power consumption. Moreover, since the gate voltage of the transistor $Q_{10}$ (which is OFF during read cycle ②) in the memory cell $MC_2$ of FIG. 1, is raised by the power supply $V_{cc}$ if the transistor $Q_4$ is kept ON for a long period of time, the flip-flop comprising the transistors $Q_{10}$ and $Q_{11}$ is liable to be inverted by the influence of electronic noise, whereby information stored in cell $MC_2$ may also be inverted during the read cycle ②. These disadvantages can be eliminated by turning ON the transistors $Q_1$ and $Q_4$ only temporarily, by applying the pulse $\overline{WE}'$ to their gates after a write cycle.

As explained previously, the present invention offers an advantage that a high readout operation rate can be maintained even when the cell area is reduced in the static RAM.

The features and advantages of the invention are apparent from the detailed specification, and thus it is intended by the appended claims to cover all such features and advantages of the memory which falls within the true spirit and scope of the invention. Further, since numerous modifications and changes will readily occur to those skilled in the art, it is not desired to limit the invention to the exact construction and operation shown and described, and accordingly all suitable modifications and equivalents may be resorted to, falling within the scope of the invention.

What I claim is:

1. A static RAM for performing read and write operations and operatively connectable to receive a write enable signal, comprising:
    a plurality of bit line pairs;
    a plurality of memory cells connected to each pair of said bit line pairs;
    a plurality of bit line load elements, one of which is connected to a respective one of said bit lines;
    a plurality of bit-line-charging transistors each having a gate, said plurality of bit-line-charging transistors respectively connected to corresponding ones of said bit lines so that each of said bit-line-charging transistors is connected between a power supply and the corresponding one of said bit lines; and
    means, connected to the respective gates of said respective bit-line-charging transistors and connected to receive the write enable signal, for providing a pulse signal whenever the write enable signal changes state at the end of each write operation, said means for providing a pulse signal comprising:
        a first inverter having an input connected to receive the write enable signal and having an output;
        a second inverter having an input connected to said output of said first inverter and having an output;
        a capacitor connected to said output of said second inverter; and
        a NOR gate having a first input connected to said output of said second inverter, having a second input connected to said output of said first inverter, and having an output connected to said respective bit-line-charging transistors.

2. A static RAM as set forth in claim 1, wherein each of said bit-line-charging transistors comprises a MOSFET, having a gate connected to the output of said NOR gate.

3. A static RAM as set forth in claim 2, further comprising word lines, wherein each of said memory cells includes first and second gate transistors both of which are controlled by a respective one of said word lines, said first and second gate transistors of each of said memory cells connected between said respective memory cells and corresponding ones of a corresponding pair of said bit lines.

4. A static RAM as set forth in claim 1 or 3, further comprising means, connected to respective pairs of said bit lines, for selectively driving said respective pairs of said bit lines, to write selected information into a selected memory cell connected to said selected bit lines.

5. A static RAM as set forth in claim 4, wherein said driving means drives one bit line of a selected pair of bit lines to approximately zero volts.

6. A static RAM as set forth in claim 5, wherein said pulse signal provided to said bit-line-charging transistors by said means for providing a pulse signal is of a duration such that a respective bit line having a voltage of approximately zero volts is charged by said corresponding bit-line-charging transistor, during said duration of said pulse signal, to an intermediate voltage level between zero volts and the voltage of the power supply.

7. A static RAM as set forth in claim 6, wherein each said memory cell selectively provides a high or low level voltage to respective ones of said pair of bit lines to which said respective memory cells are connected, and wherein said intermediate voltage level, to which said bit line is recharged by said bit-line-charging transistor, is approximately equal to said low level voltage provided to respective bit lines by respective ones of said memory cells.

8. A static RAM for performing read and write operations, comprising:
    a plurality of bit line pairs;
    a plurality of memory cells connected to each pair of said bit line pairs;

a plurality of bit line load elements, one of which is connected to a respective one of said bit lines;

a plurality of bit-line-charging transistors each having a gate, said plurality of bit-line-charging transistors respectively connected to corresponding ones of said bit lines;

means, connected to the respective gates of said respective bit-line-charging transistors, for providing a pulse signal at the end of each write operation, said pulse signal provided to said bit-line-charging transistors by said means for providing a pulse signal, said pulse signal being of a duration such that a respective bit line having a voltage of approximately zero volts is charged by said corresponding bit-line-charging transistor during said duration of said pulse signal, to an intermediate voltage level between zero volts and the voltage of a power supply; and means, connected to respective pairs of said bit lines, for selectively driving said respective pairs of said bit lines to write selected information into a selected memory cell connected to said selected bit lines, said driving means driving one bit line of a selected pair of bit lines to approximately zero volts.

9. A static RAM as set forth in claim 8, wherein each said memory cell selectively provides a high or low level voltage to respective ones of said pair of bit lines to which said respective memory cells are connected, and wherein said intermediate voltage level, to which said bit line is recharged by said bit-line-charging transistor, is approximately equal to said low level voltage provided to respective bit lines by respective ones of said memory cells.

* * * * *

UNITED STATES PATENT AND TRADEMARK OFFICE
CERTIFICATE OF CORRECTION

PATENT NO. : 4,499,559
DATED : FEBRUARY 12, 1985
INVENTOR(S) : SETSUO KURAFUJI

It is certified that error appears in the above-identified patent and that said Letters Patent is hereby corrected as shown below:

Col. 3, line 20, "②" should be -- ②) --.

Col. 4, line 37, "cells" should be --cell--.

Signed and Sealed this

Thirtieth Day of July 1985

[SEAL]

Attest:

DONALD J. QUIGG

Attesting Officer

Acting Commissioner of Patents and Trademarks